(12) United States Patent
Gapontsev et al.

(10) Patent No.: US 8,179,929 B2
(45) Date of Patent: May 15, 2012

(54) APPARATUS AND METHOD FOR SIDE MODE SUPPRESSION IN SLAVE-MASTER LASER BY SINGLE MODE FIBER AMPLIFIER

(75) Inventors: Valentin P. Gapontsev, Worcester, MA (US); Andrei Babushkin, Southbridge, MA (US); Nicholai Platonov, Worcester, MA (US)

(73) Assignee: IPG Photonics Corporation, Oxford, MA (US)

(*) Notice: Subject to any disclaimer, the term of this patent is extended or adjusted under 35 U.S.C. 154(b) by 469 days.

(21) Appl. No.: 12/321,690

(22) Filed: Jan. 23, 2009

(65) Prior Publication Data

US 2010/0189136 A1 Jul. 29, 2010

(51) Int. Cl.
*H01S 3/098* (2006.01)
*H01S 3/13* (2006.01)
*H04B 10/17* (2006.01)

(52) U.S. Cl. ........ 372/18; 372/25; 372/29.022; 359/333; 359/341.1

(58) Field of Classification Search .................. 359/333, 359/341.1; 372/18, 25, 29.022
See application file for complete search history.

(56) References Cited

U.S. PATENT DOCUMENTS

| 4,995,047 | A | * | 2/1991 | Hadley et al. ............ 372/50.123 |
| 5,053,641 | A | | 10/1991 | Cheng |
| 5,530,582 | A | | 6/1996 | Clark |
| 5,867,305 | A | * | 2/1999 | Waarts et al. ............ 359/337.12 |
| 6,212,216 | B1 | | 4/2001 | Pillai |
| 6,282,214 | B1 | * | 8/2001 | Goto et al. ............ 372/20 |
| 6,347,007 | B1 | | 2/2002 | Grubb |
| 6,917,631 | B2 | | 7/2005 | Richardson |
| 7,039,076 | B2 | | 5/2006 | Kane |
| 2005/0018724 | A1 | * | 1/2005 | Da Silva et al. ............ 372/32 |
| 2007/0041409 | A1 | * | 2/2007 | Sudarshanam et al. ............ 372/6 |
| 2008/0089369 | A1 | | 4/2008 | Luo |

OTHER PUBLICATIONS

Zhou, "Injection-Locked Dual Opto-Electronic Oscillator with Ultra-low Phase Noise and Ultra-Low spurious Level", IEEE Transactions on Microwave Theory and Techniques, vol. 53, No. 3, pp. 929-933 (2005).*
Jin et al. "Relative intensity noise study in the injection-locked integrated electroabsorption modulator-lasers", Solid-state Electronics, vol. 53, issue 1, pp. 95-101, Jan. 2009 (available online Dec. 2, 2008).*

* cited by examiner

*Primary Examiner* — Eric Bolda
(74) *Attorney, Agent, or Firm* — Timothy J. King; Yuri Kateshov

(57) ABSTRACT

A laser system for effective injection seeding is configured with a master oscillator lasing a narrowband seed radiation which is characterized by a single longitudinal master mode injected into a slave oscillator so that the latter generates a broadband slave radiation with a dominant slave mode and side slave modes. The slave radiation is coupled into an input of a SM fiber laser amplifier operative to output an amplified radiation with the spectra which is substantially as narrow as the spectra of the slave radiation.

15 Claims, 2 Drawing Sheets

APPARATUS AND METHOD FOR SIDE MODE SUPPRESSION IN SLAVE-MASTER LASER BY SINGLE MODE FIBER AMPLIFIER

BACKGROUND OF THE DISCLOSURE

1. Filed of the Disclosure

This disclosure relates to pulsed lasers. More particularly, the disclosure relates to injection seeding employed to achieve stable output generated by a single mode fiber laser and characterized by confined spectrum bandwidth and high peak pulse power or high power for a source with continuous power.

2. Discussion of the Prior Art

Master-slave laser systems with relatively high output energies and narrow linewidths are widely used in a variety of industries. Typically, these systems include a laser cavity wherein longitudinal modes oscillate to stimulate output. To meet a variety of requirements, these systems are configured to operate in single or multimode regimes. In multimode operation, more than one longitudinal mode oscillates. In single mode operation, predominantly one longitudinal mode oscillates within the cavity.

One realization of the above-disclosed systems typically may include a seed source—master oscillator—generating weak radiation, known as seed radiation, which is coupled into the laser cavity of a slave oscillator. As a result, the seed radiation excites one or more longitudinal modes within the cavity of the slave laser.

Laser systems are often required to radiate, among others, a stable output, controlled wavelength, high peak power pulse width narrow frequency bandwidth. By controlling the spectral properties of a slave oscillator by a seed oscillator the above listed objectives can be effectively attained.

Single longitudinal mode injection seeding has long been utilized as an effective process for generating radiation characterized by substantially single transverse and longitudinal mode. The degree of "substantiality" is somewhat subjective. The output of a typical master-slave semiconductor laser system is characterized by one dominant mode and side modes at the output of the slave oscillator. While the radiation spectrum is broader than the single frequency output of the master oscillator, it is still often referred to as a substantially SM radiation, which is widely accepted. The ratio between the peaks of respective dominant and side modes is a good indicator of how "substantially" single "moded" the radiation is. Referring hereinafter to this ratio as a side-mode suppression ratio (SMSR), as far as Applicants are aware of, the 30 dB SMSR is considered excellent.

However, in case the slave radiation is further amplified in the fiber amplifier to the power level (peak power) above 100 W, the spectra of the amplified radiation at the output of the amplifier is substantially wider than the slave radiation at the input of the amplifier. As a consequence, the bandwidth of the pulse emitted by the fiber amplifier will be pretty far from the single-mode radiation, have much broader spectrum than that one of the slave radiation at the input of the amplifier at so much that in certain situations the output amplified radiation may have more than one mode. As one of ordinary skills readily understands, the broadening of the radiation is explained by nonlinear process occurring in a fiber.

With the broad amplified spectrum at the output of the amplifier an SMSR associated with dominant and side modes of the amplified output radiation radically lowers. Hence, the SMSR of the slave radiation should be substantially greater than what is now considered acceptable in order to have the desired value thereof at the output of fiber amplifier.

A need, therefore, exists for a method and device operative to generate a substantially SM slave radiation having an SMSR exceeding 40 dB at the input of a single mode fiber amplifier.

A further need exists for a method and apparatus for generating a narrowed broadband slave spectra at an input of SM fiber laser which is amplified in a SM fiber laser so that a broadband amplified spectra at the output of the amplifier is substantially the same as the slave spectra at the input of the amplifier.

SUMMARY OF THE DISCLOSURE

This objective is attained by the method and device of the present disclosure. The disclosed system is based on the injection seeding method and includes a SM seed or master oscillator operative to radiate a narrowband SM light output coupled into a broadband slave oscillator. The slave radiation emitted by the slave oscillator is characterized by the SNSR above 40 dB.

In accordance with the disclosure, a single mode fiber laser system includes a source configured, among others, with semiconductor master and slave oscillators and a SM fiber amplifier. The master and slave oscillators are so configured that a broadband spectrum of the slave oscillator's radiation, which has a dominant mode and side modes, is substantially narrowed by injecting a narrowband radiation from the master oscillator. The optimization of the injection seeding process provides for the increased dominant mode and decreased side modes in the spectra of the slave radiation.

In accordance with the disclosure, under the optimized injection, the slave radiation has the narrowed spectra coupled to the input of SM fiber amplifier. The SM fiber amplifier is operative to amplify the slave spectra so that the amplified radiation at the output of the SM fiber laser has a spectra which is substantially as narrow as the slave spectra. Accordingly, the amplifier, which has a length above 10 cm, outputs a substantially single mode pulse or continuous radiation with a peak-power or power, respectively, exceeding 100 W and having a narrow broadband which is comparable with the slave broadband at the input of the amplifier.

According to one aspect, the disclosed method for generating a narrowband, high-power peak pulse radiation allows for a high precision match between the seed mode and one of the slave modes. In particular, the length of the slave oscillator's resonator is controlled by adjusting the temperature so that the dominant mode of the slave spectra literally saturates the energy from side modes which become smaller and less significant. Eventually, the opposite growth of the dominant and side mode leads to a high SMSR of the slave spectra corresponding to the desired reference value. Such an enhanced slave mode is further coupled into the SM fiber amplifier which, thus, is operative to output an amplified radiation with a spectra comparable to the slave spectra at the input of the amplifier. In other words, because the side modes of the slave spectra are considerably decreased and the dominant mode is correspondingly increased, their amplification in a relatively long SM fiber amplifier does not allow the amplified side modes to substantially affect the amplified dominant mode of the spectra of the output radiation. Hence, the amplified high power pulses or continuous output radiation can indeed be called a SM output radiation, which, in case of semiconductor lasers, is substantially more pure than those achieved by the known prior art.

In accordance with a further aspect, the disclosed method provides for increasing a peak power of pulses amplified by and output by a fiber amplifier. In contrast to a device implementing the method in accordance with one aspect and, as a rule, having a continuous wave seed laser, here the seed laser has a pulsed configuration. If the seed oscillator operates in a continuous wave regime, part of the latter continuously reflects from a slave oscillator and subsequently is amplified in the amplifier. Under certain conditions, this reflected continuous radiation may have the energy comparable to the energy contained in a pulse. As a consequence, the resulting pulses may not have the desired characteristics simply because the pulses do not contain sufficient energy. Utilizing the pulsed-configured seed oscillator, the resulting pulses are more powerful because the energy of the reflected radiation is contained with an a pulse at the output of the fiber amplifier.

Still a further aspect of the disclosure relates to a device implementing the above-disclosed methods. The device is operative to radiate visible light and configured with a means operative to generate second harmonic in order to obtain the desired wavelength.

BRIEF DESCRIPTION OF THE DRAWINGS

The above and other aspects, features and advantages will become more readily apparent from the following specific description accompanied by the drawings, in which.

SPECIFIC DESCRIPTION

As will be disclosed hereinbelow, there is disclosed herein an injection seeding laser system operative to provide for master-slave resonance.

Figure 1:
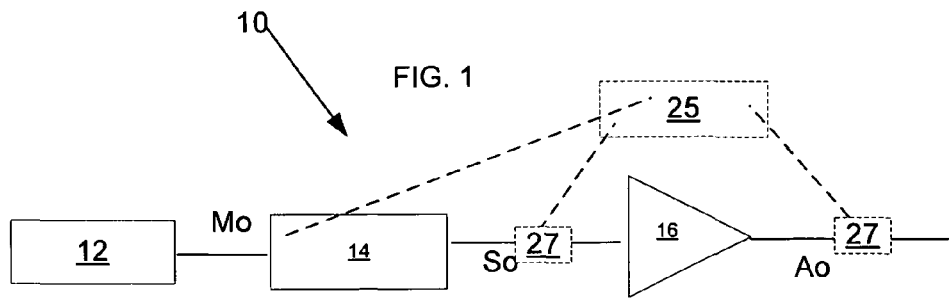
FIG. 1 is a block diagram of master-slave laser configuration according to the present disclosure.
Figure 2:
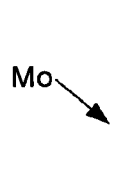
FIG. 2 is a graphic illustration of the single longitudinal mode radiation emitted by the seeder of the laser configuration of FIG. 1.

Referring to FIG. 1, a master-slave laser system 10 is configured with a seed oscillator 12 as the master, a seeded laser 14 as the slave and an amplifier 16. The seed oscillator or laser 12 is energized by a driving circuit (not shown). As the drive current varies, the wavelength of the seed light emitted from seed oscillator 12 changes, which results in a longitudinal single mode (frequency) continuous wavelength narrowband spectra Mo, illustrated in FIG. 2. The configuration of seed oscillator 12 further includes a beam shaping optics which is not shown, but well known to one of ordinary skills in the pulsed laser art. The optics defines an external resonant cavity with the input reflective component of the internal resonant cavity of semiconductor oscillator 12. Such a configuration, as readily realized by the artisan, provides for shaping radiation so that a seed radiation Mo has a seed spectra characterized by a single longitudinal mode or frequency. The narrowband radiation Mo is injected into the slave oscillator 14. As can be appreciated by those skilled in the art, the seed laser is preferably semiconductor, but may be implemented as a laser diode, fiber laser and others each operative to radiate a narrowband spectrum.

The slave oscillator 14 is energized by a pumping unit (not shown) so that population inversion is created. The slave oscillator 14 is advantageously, BUT NOT necessarily, configured as a semiconductor laser which, as known, can be switched between "on" and "off" states at a high repetition rate. However, the slave radiation So outputted from slave oscillator 14 so as to propagate further towards amplifier 16, can be also continuous.

Figure 3:
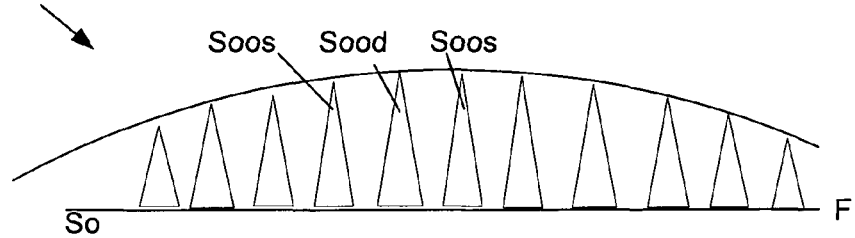
FIG. 3 illustrates the broadband spectrum at the output of the slave without the use of the seeder.

FIG. 3 illustrates the spectrum of the slave radiation characterized by a broadband spectra which has a plurality of longitudinal modes Soo and corresponding to an apparatus which does not employ injection seeding. Assuming that the bandwidth is of about 10 nm, more than hundred longitudinal modes Soo can be observed within this bandwidth. Such a great multiplicity of longitudinal modes Soo is a consequence of the wide spectra and is inherent to a semiconductor structure. The overall length of slave 14 may be, for example, about 1.5 mm. With this geometry, the modes are equidistantly spaced from one another at a distance of about 0.1 nm. As is known, the modes very gradually increase toward the center line of the spectra. As a consequence, the energy stored in adjacent modes is substantially the same. Because of relative uniformity of the modes, the slave radiation of FIG. 3 is unlikely single-moded.

A challenge to laser pulses in the nanosecond regime is achievement of Fourier transform limited linewidth. With the implementation of the present method, graphically disclosed, high beam-quality laser output of nanosecond pulse width and nanometer bandwidth can be achieved in an efficient and cost-effective manner if, according to the disclosure, the seed mode Mo matches precisely one of the modes of slave radiation So.

Figure 4:
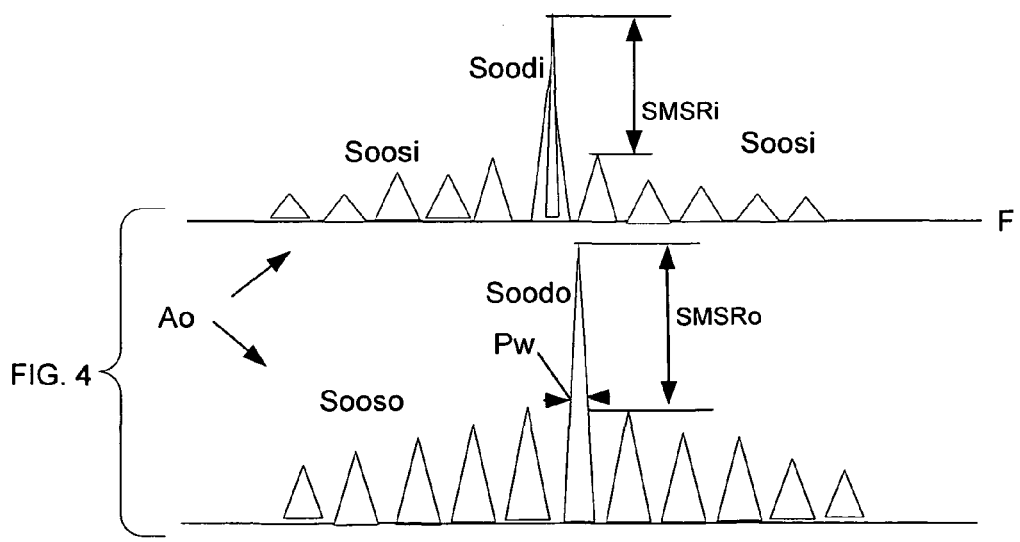
FIG. 4 very diagrammatically displays the spectra of the slave radiation at the input of a SM fiber amplifier and the spectra of the amplified output radiation produced the master-slave configuration of FIG. 1.

FIG. 4 illustrates the spectra of the seed injected slave radiation generated by slave oscillator 14 and coupled to the input of SM fiber amplifier 16 and the spectra of the amplified radiation at the output of amplifier 16. In particular, in accordance with the concept of the disclosure seed mode Mo is injected into slave oscillator 14 so that it matches perfectly with dominant mode Soodi of the slave spectrum. The dominant slave mode Sodi spans over the master mode Mo. While the spectra is shown highly diagrammatically, it is clear that the dominant slave mode Soodi is substantially greater than side modes Soosi. Accordingly, the slave radiation further coupled into the input of SM fiber amplifier 16 is substantially single moded because the dominant slave mode sucked in some energy from the side slave mode which, thus, affect the dominant mode in a much lesser degree that than of FIG. 3.

One of the convenient characteristics of any radiation is a so-called side-mode suppression ratio (SMSR). This is a ratio between the peaks of the dominant and side modes, respectively. Generally, the SMSR of the slave radiation So can, in a certain degree, indicate the character of this radiation. In general, the greater the SMSR of the slave radiation So, the more pure the SM character of this radiation. As a rule, in semiconductor lasers, the SMRS does not exceed 30 dB. When the slave radiation So with such a relatively low SMSR is further amplified in fiber amplifier 16, the side modes tend to interact with the dominant mode, i.e. the light energy distributes between multiple modes and is not concentrated in one dominant mode.

The disclosed method, however, allows the single mode of the slave radiation So to be much more pronounced because the dominant slave mode takes additional energy from side slave modes reducing, thus, the degree of influence the side modes may have upon the dominant mode during amplification. Accordingly, when the slave radiation So is coupled into the input of SM fiber amplifier 16 and is further amplified, the spectra of the output radiation Ao is as relatively narrow as that one of the slave radiation So at the input of amplifier 16. Of course, the dominant and side modes change during the amplification and the dominant mode Soodo of the output radiation Ao is somewhat smaller than the dominant slave mode Soodi, but it still preserves its commanding presence among the side modes of the output radiation Ao. As a consequence, the output radiation Ao can a purer single mode than the prior art, particularly, when the power of output radiation Ao exceed 100 W. At these powers, the SMSR associated with the amplified output radiation Ao is substantially higher than 10 dB which can be considered as an excellent result for the semiconductor MOPA.

The process of injection is optimized that the dominant mode begins to suck the inversion from side impulses. As a result, the side modes get smaller while the peak of the dominant mode grows up, which leads to such a narrowed bandwidth of slave radiation So which is not substantially disturbed during amplification in SM amplifier 16.

Figure 5:
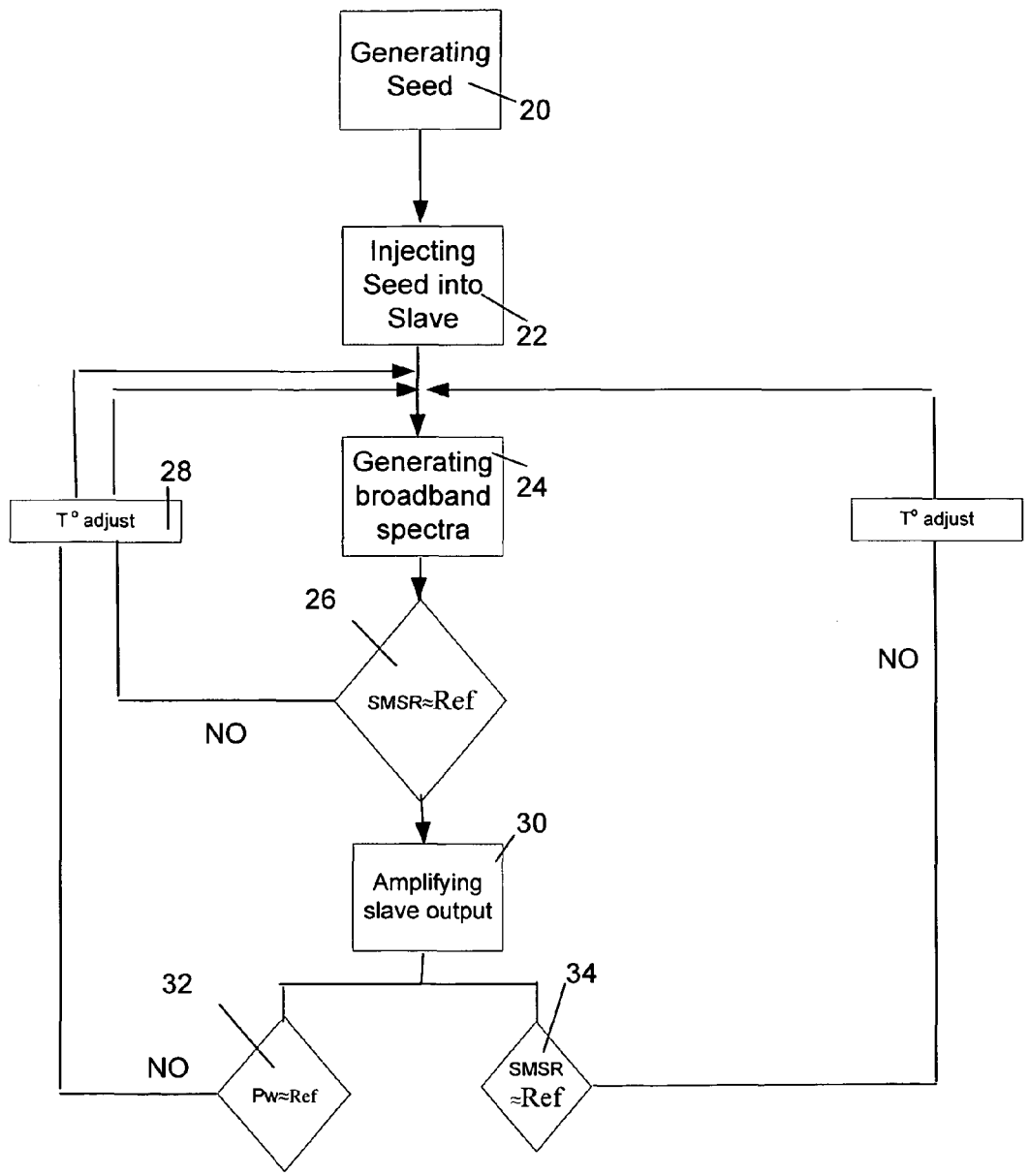
FIG. 5 is a flow chart illustrating a process for controlling several parameters of the output radiation.

FIG. 5 illustrates a flow chart of the disclosed method. Upon generating seed 12 in step 20, the mode Mo is injected into slave 14 in step 22, which in turn generates slave radiation which has a broad spectra with one of the modes Sood being dominant and adjacent side modes Sood being smaller than the dominant mode. In accordance with optimized conditions of the injection seeding, the single mode Mo is injected at the point when the Mo and the dominant mode Sood perfectly match one another. Only under these conditions, the growth of the dominant mode sufficiently suppresses the decrease of side mode Soos which leads to a narrowed spectra of the slave radiation.

To determine how well the Mo and Sood modes match, it is necessary that the slave radiation So be evaluated by a controlling means 25 of FIG. 1. One of alternatives offered by the disclosed method and shown in step 30 of FIG. 5 is to evaluate the SMSR at the output of amplifier 16 of FIG. 4 operative to amplify slave radiation So and outputting radiation Ao (FIG. 1).

The evaluation of the slave radiation So may implemented by several techniques. As shown in step 32, a pulse width Pw, i.e. the width of dominant mode Sood is measured by well known to one of ordinary skills methods. If the measured width corresponds to the desired value Pref, the master-slave system 10 operates at the desired level and no adjustments are necessary. If, however, the measured pulse width is unsatisfactory, a temperature of the resonant cavity of slave 14 is adjusted by utilizing TEL or Peltier elements, as shown in step 28, which leads to the adjustment of the resonant cavity so as to obtain the desired pulse width.

Alternatively or in addition, the modulated So radiation may be evaluated based on determining the SMSR, as illustrated instep 34. If the measured SMSR corresponds to a reference value Ref, the radiation is satisfactory and is known to provide for a SM output pulse of a laser device. If the measured SMSR substantially differs from the reference Ref, the temperature of the resonant cavity of slave 14 is adjusted by manipulating a driving current. To have controller 25 operate, signals from respective indicators 27, which are coupled to slave radiation So and amplified slave radiation Ao, are sent to the controller.

As can be seen, the disclosed method provides for the injection of the seed mode Mo so that it matches with one of the slave modes in a manner providing for the suppression of the side modes and increase of the dominant mode. As a consequence, when amplified by single mode long fiber laser 16, the spectrum of the slave radiation So still remains so narrowed that the pulses, while reaching 500 W and higher, are substantially single-moded because of the side modes do not affect the dominant mode.

Figure 6:
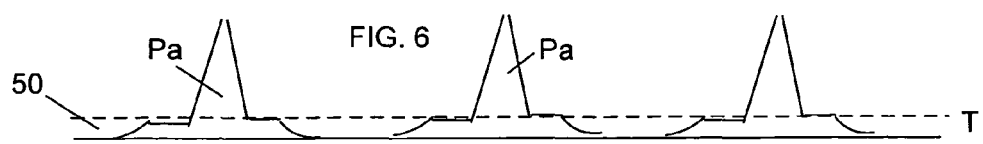
FIG. 6 displays waveforms of pulses outputted by an amplifier in accordance with a further modification of the master-laser configuration of FIG. 1.

FIG. 6 illustrates a further modification of the disclosed concept in accordance with which seed 12 is configured to operate in a pulsed regime. Typically, in case of a CW seed configuration, part of the seed radiation constantly reflects from slave 14 along the light path towards fiber amplifier 16 of FIG. 1. As a result, the pulses Pa at the output of amplifier 16, which are shown in a temporal domain, literally stand on a pedestal 52—a certain level of energy that could be otherwise stored in the amplified pulses. Accordingly, the energy within pedestal 50 is useless and, in fact, can be harmful when it reaches a level comparable to the pulse energy which is likely to happen at a certain time.

To eliminate pedestal 50, seed 12 is configured as a semiconductor laser operating in a pulsed regime. Accordingly, when seed 12 does not emit pulses, there is no radiation that can be reflected from slave 14 and further amplified in amplifier 16. The timing between the seed and slave oscillators is controlled so that amplified pulses Pa each have rather a trapezoidal base 52 and thus are somewhat longer, for example, 0.03 µs. However, the pulses each are very powerful with the pulse width is still not exceeding 0.001 µs.

Figure 7:
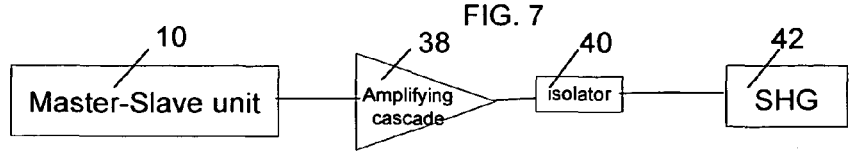
FIG. 7 is a schematic of an exemplary device implementing the disclosed method.

FIG. 7 illustrates an exemplary laser assembly configured with disclosed master-slave laser system 10 of FIG. 1 and operative to output light in the desired band range. For example, the laser system is operative to radiate Green light. Structurally, the laser assembly of FIG. 7 includes a pulse forming unit configured as master-slave laser system 10. The pulsed radiation emitted by system 10 may be amplified in one or multiple amplifying cascades 38. To avoid detrimental effects of back radiation, an isolator 40 is coupled to the output of amplifying cascade 38. Finally, a nonlinear element such as crystal 42 is operative to generate second harmonic at the desired wavelength. The assembly may also have a one or a plurality of filters and other components well known in the art.

Although shown and disclosed is what is believed to be the most practical and preferred embodiments, it is apparent that departures from the disclosed configurations and methods will suggest themselves to those skilled in the art and may be used without departing from the spirit and scope of the disclosure defined within the scope of the appended claims.

The invention claimed is:

1. A method for generating high peak power narrow spectrum optical radiation, comprising:
    exciting a master oscillator so as to lase a narrowband seed radiation having a single longitudinal master mode;
    providing a slave oscillator operative to generate a broadband slave radiation having a plurality of longitudinal side slave modes and a dominant slave mode; and
    injecting the single longitudinal master mode into the dominant slave mode so that the dominant slave mode increases while suppressing the side slave modes, thereby providing the slave radiation with a narrowed spectra in which a side mode suppression ratio (SMSR) between the dominant and side slave modes exceeds 40 dB;
    determining the SMSR at the output of the slave oscillator and comparing the determined SMSR to a SMSR reference value; and controlling a length of a resonant cavity of the slave oscillator by changing a temperature therein if the determined and reference SMSR are substantially different.

2. The method of claim 1 further comprising amplifying the slave radiation in a single mode fiber laser amplifier which outputs an amplified radiation of at least 100 W, the amplified output radiation having an output spectra at an output of the SM fiber amplifier which is substantially as narrow as the narrowed slave spectra at an input of the single mode fiber laser amplifier, the output spectra having amplified dominant and side modes with an output SMSR exceeding 10 dB.

3. The method of claim 2 further comprising determining the SMSR at the output of the amplifier and comparing the determined SMSR to a SMSR reference value.

4. The method of claim 1 further comprising controlling a length of the resonant cavity by changing a temperature therein if the determined and reference SMSR are substantially different.

5. The method of claim 2 further comprising determining a pulse width of the SM pulse at the output of the amplifier and comparing the determined pulse width to a reference value.

6. The method of claim 5 further comprising adjusting a length of a resonant cavity of the slave oscillator so as to achieve a desired pulse width if the determined and reference pulse widths are substantially different.

7. The method of claim 1, wherein the master oscillator is configured to operate in a regime selected from the group consisting of a continuous wave mode and a pulsed mode.

8. The method of claim 2, wherein the single mode fiber amplifier has a length exceeding 10 cm.

9. A master-slave laser system comprising:
a seed oscillator operative to generate a narrowband radiation including a single longitudinal master mode; and
a slave oscillator operative to lase a broadband radiation including dominant and side longitudinal slave modes, wherein the single longitudinal master mode is injected into the dominant slave mode so that the dominant slave mode suppresses the side slave modes so as to have a side mode suppression ratio (SMSR) exceeding 40 dB at an output of the slave oscillator,
configured to determine the SMSR at the output of the slave oscillator and comparing the determined SMSR to a SMSR reference value,
and configured to control a length of a resonant cavity of the slave oscillator by changing a temperature therein if the determined and reference SMSR are substantially different.

10. The master-slave laser system of claim 9 further comprising a single mode amplifier coupled to the output of the slave oscillator, the single mode amplifier being operative the amplify the slave radiation so that the amplified slave radiation has a peak power of at least 500 W and a spectrum in which the amplified dominant mode so suppresses the amplified side slave modes that the amplified radiation is a substantially single mode radiation with the SMSR exceeding 30 dB.

11. The master-slave laser system of claim 9 further comprising a guide component coupled between the seed and slave oscillators and operative to control a light path of the broadband radiation, wherein the guide component is selected from the group consisting of a splitter and circulator.

12. The master-slave laser system of claim 10 further comprising a controller configured to adjust a length of the resonant cavity of the slave oscillator in response to a signal generated by an indicator coupled to a location selected from the group consisting of an output of the slave oscillator, output of the amplifier and a combination of these, the signal indicating that at least one of parameters of the slave radiation deviates from a desired reference value.

13. The master-slave laser system of claim 12, wherein the at least parameter is selected from the group consisting of an SMSR reference value, a width of the exited longitudinal mode reference value and a combination thereof.

14. The master-slave laser system of claim 9, wherein the seed oscillator operates in a mode selected from the group consisting of a continuous wave- and pulsed-configuration.

15. The master-slave laser system of claim 10, wherein the seed and slave oscillators have respective semiconductor structures and the amplifier has a fiber configuration.

* * * * *